United States Patent [19]
Farnworth et al.

[11] Patent Number: 5,716,218
[45] Date of Patent: Feb. 10, 1998

[54] PROCESS FOR MANUFACTURING AN INTERCONNECT FOR TESTING A SEMICONDUCTOR DIE

[75] Inventors: Warren M. Farnworth, Nampa; Salman Akram; Alan G. Wood, both of Boise, all of Id.

[73] Assignee: Micron Technology, Inc., Boise, Id.

[21] Appl. No.: 524,018

[22] Filed: Sep. 5, 1995

Related U.S. Application Data

[63] Continuation-in-part of Ser. No. 387,687, Feb. 13, 1995, Pat. No. 5,686,317, which is a continuation-in-part of Ser. No. 137,675, Oct. 14, 1993, abandoned, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.$^6$ .............. H01L 21/66; H01L 21/603
[52] U.S. Cl. .............. 438/15; 438/17; 438/611; 438/665; 438/666; 438/673; 438/701; 438/734; 438/736; 29/25.01
[58] Field of Search .............. 438/15, 17, 665, 438/666, 673, 611, 701, 734, 736, 942, 964, 970, 978; 29/25.01

[56] References Cited

U.S. PATENT DOCUMENTS

| | | | |
|---|---|---|---|
| 4,553,192 | 11/1985 | Babuka et al. | 361/395 |
| 4,899,107 | 2/1990 | Corbett et al. | 324/518 F |
| 4,899,921 | 2/1990 | Bendat et al. | 228/105 |
| 4,937,653 | 6/1990 | Blonder | 357/68 |
| 5,051,379 | 9/1991 | Bayer et al. | 437/225 |
| 5,072,289 | 12/1991 | Sugimoto et al. | 357/68 |
| 5,073,117 | 12/1991 | Malhi et al. | 439/71 |
| 5,088,190 | 2/1992 | Malhi et al. | 29/843 |
| 5,090,118 | 2/1992 | Kwon et al. | 29/843 |
| 5,103,557 | 4/1992 | Leedy | 29/832 |
| 5,123,850 | 6/1992 | Elder et al. | 439/67 |
| 5,225,037 | 7/1993 | Elder et al. | 156/644 |
| 5,302,891 | 4/1994 | Wood et al. | 324/158 F |
| 5,326,428 | 7/1994 | Farnworth et al. | 156/654 |
| 5,408,190 | 4/1995 | Wood et al. | 324/765 |
| 5,419,807 | 5/1995 | Akram et al. | 156/647.1 |
| 5,440,240 | 8/1995 | Wood et al. | 324/765 |
| 5,596,283 | 1/1997 | Mellitz et al. | 324/754 |

OTHER PUBLICATIONS

Yamamoto, Yasuhiko et al., "Evaluation of New Micro-Connection System Using Microbumps", Technical Paper, Nitto Denko Corporation, ISHM 1993 Proceedings, pp. 370–378.

Primary Examiner—David Graybill
Attorney, Agent, or Firm—Stephen A. Gratton

[57] ABSTRACT

A method for forming a compliant interconnect for making a temporary (or permanent) electrical connection with a semiconductor die. The compliant interconnect includes raised contacts having penetrating projections for penetrating contact locations on the die (e.g., bond pads) to a limited penetration depth. In an illustrative embodiment raised contacts are formed on a silicon substrate as raised pillars with a hollow etched interior portion. A tip of the raised contacts is formed as a thin flexible membrane to permit a desired amount of flexure or compliancy under loading from the die held in a test fixture. In an alternate embodiment the raised contacts are formed on a hollow flexible base portion. In another alternate embodiment the raised contacts are formed on a flexible membrane mounted to a support substrate having etched pockets filled with an elastomeric material.

35 Claims, 4 Drawing Sheets

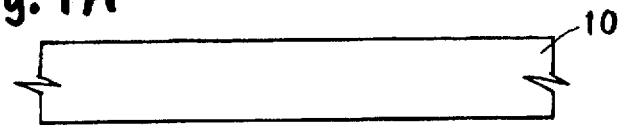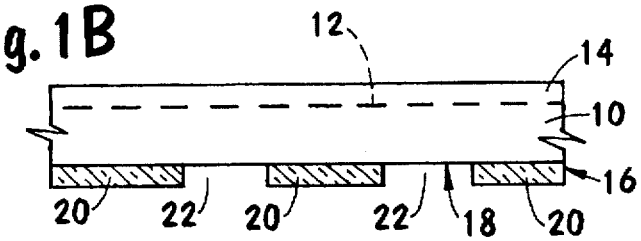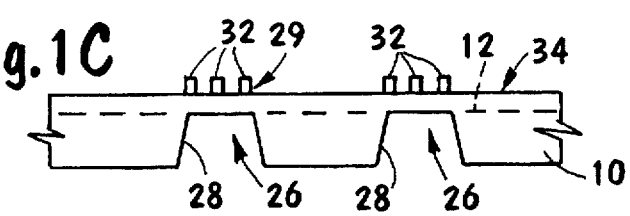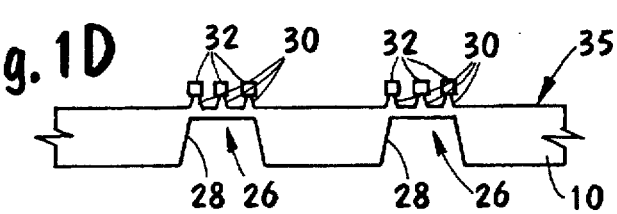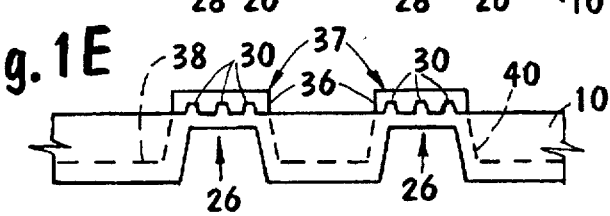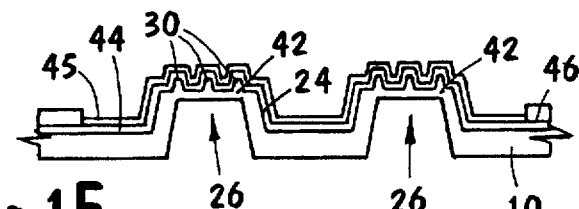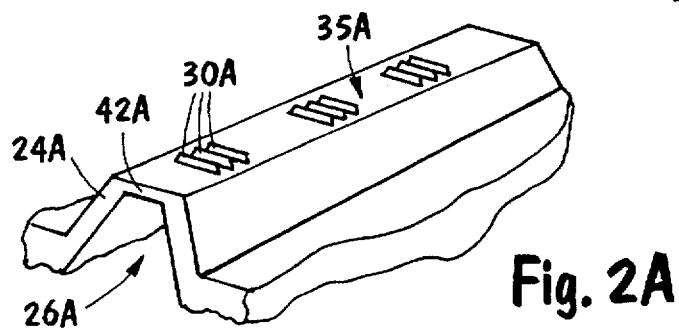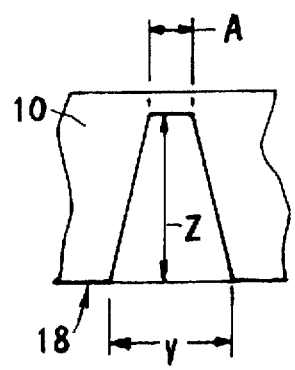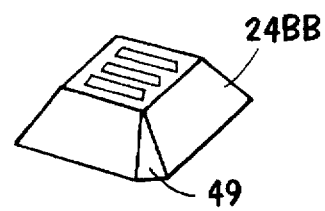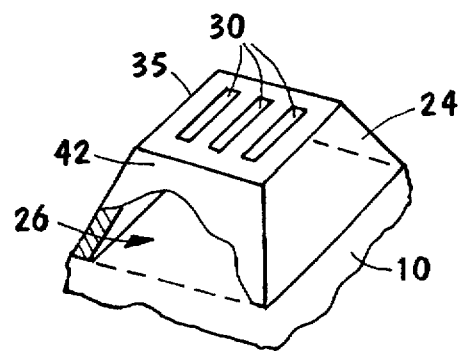

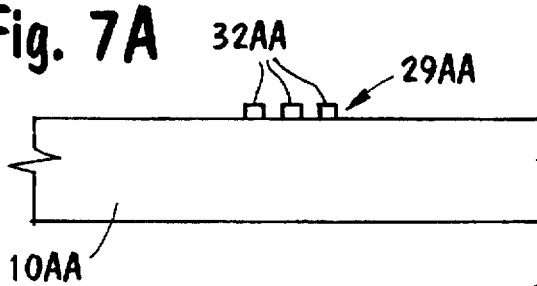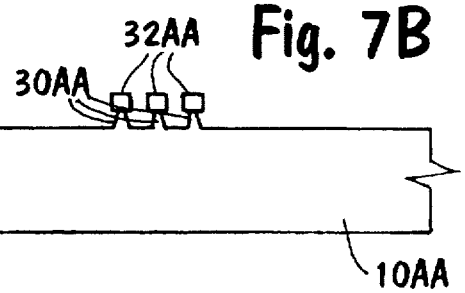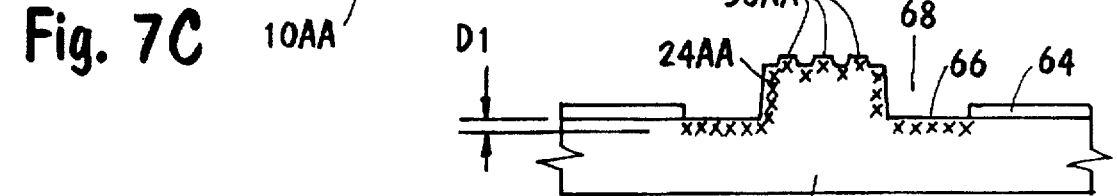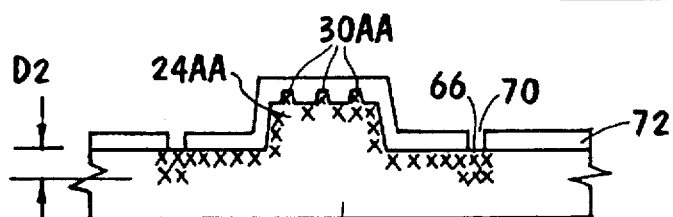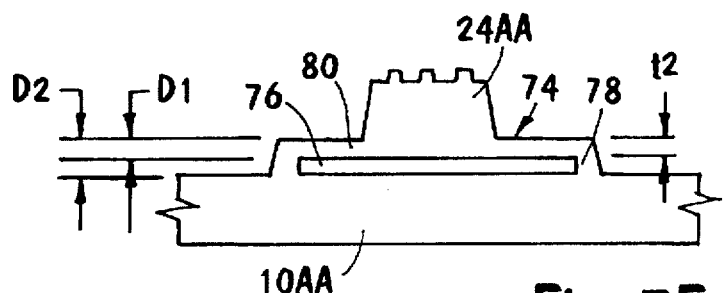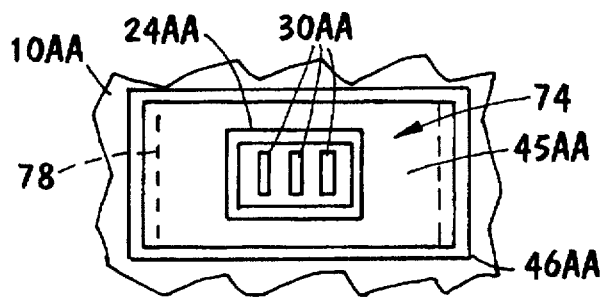

PROCESS FOR MANUFACTURING AN INTERCONNECT FOR TESTING A SEMICONDUCTOR DIE

CROSS REFERENCE TO RELATED APPLICATIONS

This is a continuation-in-part of application Ser. No. 08/387,687 filed on Feb. 13, 1995, U.S. Pat. No. 5,686,317, which is a continuation in part of application Ser. No. 08/137,675 filed on Oct. 14, 1993, abandoned, which is a continuation-in-part of application Ser. No. 07/709,858 filed on Jun. 4, 1991, abandoned, application Ser. No. 07/788,065 filed on Nov. 5, 1991, U.S. Pat. No. 5,440,240, and application Ser. No. 07/981,956, filed Nov. 24, 1992, U.S. Pat. No. 5,539,324.

This application is related to applications Ser. No. 08/335,267 filed Nov. 7, 1994, U.S. Pat. No. 5,483,741; Ser. No. 08/206,747 filed Mar. 4, 1994, U.S. Pat. No. 5,523,697; Ser. No. 08/073,005 filed Jun. 7, 1993, U.S. Pat. No. 5,408,190; Ser. No. 08/073,003 filed Jun. 7, 1993, abandoned; Ser. No. 08/120,628 filed Sep. 13, 1993 abandoned; Ser. No. 07/896,297 filed Jun. 10, 1992, U.S. Pat. No. 5,424,652; Ser. No. 08/192,391 filed Feb. 3, 1994, U.S. Pat. No. 5,483,174; Ser. No. 08/137,675 filed Oct. 14, 1993, abandoned, all of which are incorporated herein by reference.

FIELD OF THE INVENTION

This invention relates to semiconductor manufacture and more particularly to a compliant interconnect suitable for making a temporary or permanent electrical connection to an unpackaged semiconductor die.

BACKGROUND OF THE INVENTION

Microelectronic packages, called "multi chip modules" or "hybrids", are assembled using unpackaged semiconductor dice. Prior to the assembly procedure, each unpackaged die must be tested to measure its quality and reliability. This has led to the development of test procedures suitable for testing unpackaged semiconductor dice. Known-good-die (KGD) refers to an unpackaged die having the same quality and reliability as the equivalent packaged die.

Testing includes burn-in testing wherein the dice are heated while the integrated circuits are electrically biased. In addition, the dice are subject to speed and functionality tests to check the performance of the integrated circuits and devices formed on the dice. Among the parameters tested are input and output voltages, capacitance and current specifications. Memory chips are also put through logic tests wherein data storage, retrieval capabilities and response times are measured.

For testing and burning-in unpackaged dice, temporary carriers have been used in the manufacturing process in place of conventional single chip packages. This type of carrier typically includes a base for retaining and housing a single die. The carrier also includes an interconnect that allows a temporary electrical connection to be made between an individual die and external test circuitry. Carriers for testing unpackaged dice are disclosed in U.S. Pat. No. 4,899,107 to Corbett et al., U.S. Pat. No. 5,302,891 to Wood et al. and U.S. Pat. No. 5,408,190 to Wood et al., which are commonly assigned with the present application.

One of the key design considerations for a carrier is the method for establishing a temporary electrical connection with the bond pads on the die. With some carriers, the die is placed circuitry side down in the carrier and biased into contact with the interconnect. The interconnect contains the contact structure that physically aligns with and contacts the bond pads of the die. Exemplary contact structures include wires, needles, and bumps. The mechanisms for making electrical contact include piercing the native oxide of the bond pad with a sharp point, breaking or burnishing the native oxide with a bump, or moving across the bond pad with a contact adapted to scrub away the oxide. In general, each of these contact structures is adapted to form a low-resistance contact with the bondpad.

With this method for testing unpackaged semiconductor dice, it is preferable to perform the test procedure without damaging the die. The bond pads of a die are particularly susceptible to damage by the contact structure of the carrier during formation of the temporary electrical connection. It is also advantageous for the contact structure on the carrier to compensate for differences in the vertical location of the bond pads.

Besides testing of unpackaged dice to form known good die, it is sometimes necessary to establish a temporary electrical connection with semiconductor dice contained on a semiconductor wafer. As an example this can occur in the testing of the dice before singulation from the wafer. It is also sometimes necessary to establish a permanent electrical connection between unpackaged dice such as in the formation of multi chip modules.

The present invention is directed to an improved compliant interconnect suitable for establishing a temporary or permanent electrical connection with bond pads or other contact locations on a semiconductor die. The interconnect is adapted to make a low resistance electrical connection with a die without damaging the bond pads of the die. In addition the interconnect can be formed of a material such as silicon having a thermal coefficient of expansion matching that of a semiconductor die or wafer.

In view of the foregoing it is an object of the present invention to provide an improved compliant interconnect for semiconductor dice and a method for forming the interconnect.

It is yet another object of the present invention to provide an improved method for making a temporary or permanent electrical connection to semiconductor dice.

Other objects, advantages, and capabilities of the present invention will become more apparent as the description proceeds.

SUMMARY OF THE INVENTION

In accordance with the present invention, an improved compliant interconnect for semiconductor dice and a method for making the interconnect are provided. The interconnect is adapted to make an electrical connection to contact locations, typically bond pads, on unpackaged dice. The interconnect can be used for making a temporary electrical connection to a singulated die, or dice contained on a wafer, in order to test the integrated circuitry contained on the dice. The interconnect can also be used to establish a permanent electrical connection to one or more dice or for interconnecting multiple semiconductor dice.

In an illustrative embodiment the interconnect includes a silicon substrate and raised contact structures formed with an etched, hollow interior portion. The raised contact structures are formed with penetrating projections for penetrating the contact locations on the die to a limited penetration depth. The penetrating projections are formed on a flexible membrane portion of the contact Structures. The dimensions of the flexible membrane portion are controlled to provide a desired compliancy or spring constant for the contact structures. In addition, the contact structures are overlaid with a conductive material in electrical communication with conductive traces for conducting signals to and from the contact structures.

For testing an unpackaged semiconductor die the interconnect is used with a carrier adapted to hold the die and to bias the die and interconnect together.

In an alternate embodiment of the invention the interconnect includes contact structures formed on a compliant hollowed out base portion. The base portion is formed by implanting dopants into the substrate and then etching away the area of the substrate that has not been implanted.

In another alternate embodiment of the invention the interconnect includes raised contact members mounted on an etched pocket formed in a baseplate. The etched pocket can be filled with a compliant material such as a silicone adhesive. The etched pocket and compliant material can be sized for mounting one contact structure or several contact structures.

BRIEF DESCRIPTION OF THE DRAWINGS

FIG. 1A–1F are schematic cross sectional views illustrating steps involved in a process for forming an interconnect in accordance with the invention;

FIG. 1CC is an enlarged schematic cross sectional view of a portion of the structure shown in FIG. 1C;

FIG. 2 is an enlarged perspective view partially cut away of a contact structure formed in accordance with the process illustrated in FIGS. 1A–1F;

FIG. 2A is an enlarged perspective view of an alternate embodiment contact structure;

FIG. 2B is an enlarged perspective view of an alternate embodiment contact structure;

FIGS. 7A–7F are schematic cross sectional views illustrating steps involved in a process for forming a compliant interconnect in accordance with an alternate embodiment of the invention;

FIG. 7FF is a plan view of FIG. 7F; and

DETAILED DESCRIPTION OF THE PREFERRED EMBODIMENT

Figure 3:
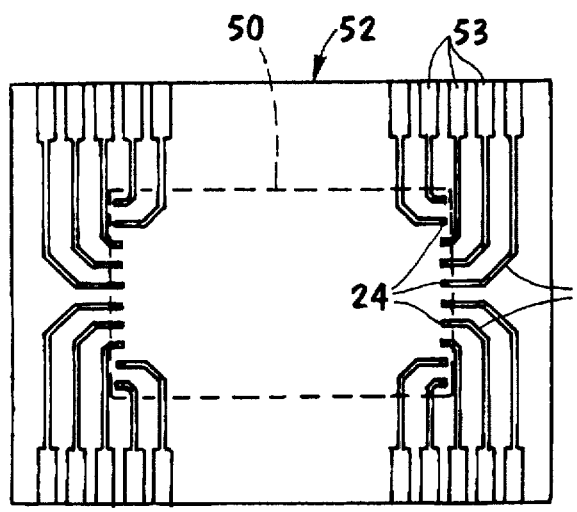
FIG. 3 is a plan view of the interconnect and a semiconductor die superimposed on the interconnect.

Referring now to FIGS. 1A–1F, a process for forming an interconnect adapted to establish an electrical connection with contact locations on a semiconductor die is shown. This electrical connection can be a temporary electrical connection for testing an unpackaged die or a permanent electrical connection such as for forming a multi chip module.

Initially, as shown in FIG. 1A, a substrate 10 is formed of a material having a coefficient of thermal expansion (CTE) that closely matches the CTE of a silicon die. Suitable materials for the substrate 10 include monocrystalline silicon, silicon-on-glass, silicon-on-sapphire, germanium, and ceramic.

Next, as shown in FIG. 1B, an etch stop 12 is formed in the substrate 10 by implanting a portion 14 of the substrate 10 with a dopant such as boron. The dopant can be ion implanted and then driven into the substrate 10 to a desired depth by annealing using techniques that are known in the art. As will be further explained, the etch stop 12 is used to end point a subsequent etch process of a backside of the substrate 10.

As also shown in FIG. 1B, a first etch mask 16 is formed on a first surface 18 (i.e., backside) of the substrate 10. The etch mask 16 can be formed of a material such as silicon nitride ($Si_3N_4$), by blanket depositing a layer of the material (e.g., CVD) followed by photopatterning and then etching (e.g., wet or dry etching). A typical thickness for the etch mask 16 is about 500 Å to 3000 Å. The etch mask 16 includes masking blocks 20 and openings 22 therebetween. An etch mask 16 formed of silicon nitride can be etched with a pattern of openings 22 using hot (e.g., 180° C.) phosphoric acid. A dry etch process with a suitable etchant species can also be used for this etch. Viewed from above, the masking blocks 20 can be rectangular blocks formed in a parallel spaced pattern. This parallel spaced pattern corresponds to the spacing of contact locations on a semiconductor die.

Next, as shown in FIG. 1C, etched pockets 26 are formed in the substrate 10 using the first etch mask 16 (FIG. 1B). The pockets 26 can be etched in the substrate 10 using a wet or dry isotropic, or anisotropic, etch process. The etch stop 12 formed in the substrate 10 can be used to control the depth of the pockets 26. For a substrate 10 formed of silicon, a wet etchant such as a solution of KOH and $H_2O$ can be utilized to anisotroprically etch the grooves 26. This type of etching is also known in the art as bulk micro-machining. The etched pocket 26 include sloped sidewalls 28. The slope of the sidewalls 28 is a function of the different etch rates of monocrystalline silicon along the different crystalline orientations. This etch angle is approximately 54°.

Following formation of the etched pockets 26, the first etch mask 16 (FIG. 1B) is stripped. With the first etch mask 16 formed of silicon nitride, the mask can be stripped using a wet etchant such as $H_3PO_4$ that is selective to the substrate 10. As is apparent, the etch step for forming the etched pockets 26 can be performed after formation of the contact structure 24 (FIG. 1F). As will become apparent, the etch step for forming the etched pockets 26 controls a thickness of a membrane portion 42 (FIG. 1F) of the contact structure 24. In addition, as shown in FIG. 1CC, the etch process is controlled such that a width of the opening "y" on the surface 18 of the substrate 10 is selected to achieve a depth "z" and a width "x" at the bottom of the pocket 26.

As also shown in FIG. 1C, a second etch mask 29 having masking blocks 32, is formed on a second surface 34 (i.e., front side) of the substrate 10. The second etch mask 29 and masking blocks 32 can be formed as previously described out of a material such as silicon nitride ($Si_3N_4$) by blanket depositing the material (e.g., CVD) followed by photopatterning and then etching (e.g., wet or dry etch).

Next, as shown in FIG. 1D, the exposed substrate 10 between the masking blocks 32 is etched to form penetrating projections 30. In this step a wet or dry isotropic, or anisotropic, etch process is used to form the projections 30 as the material under the masking blocks 32 is undercut by the etchant reacting with the substrate 10. In other words, the exposed substrate 10 between the masking blocks 32 etches faster than the covered substrate 10 under the masking blocks 32.

Figure 6:
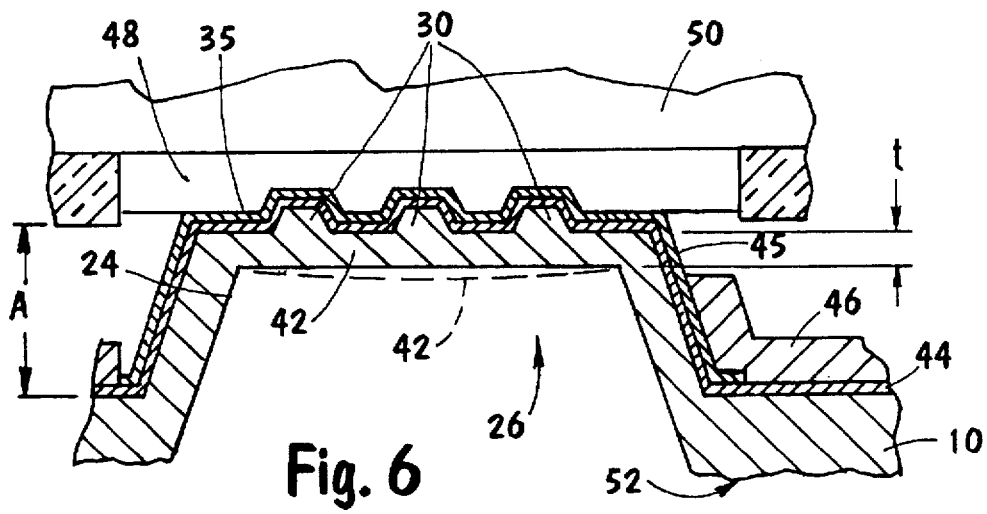
FIG. 6 is an enlarged cross sectional view taken along section line 6—6 of FIG. 4.

For an anisotropic etch, in which the etch rate is different in different directions, an etchant solution containing a mixture of KOH and $H_2O$ can be utilized. This results in the penetrating projections 30 formed as blades having sidewalls that are sloped at an angle of approximately 54° with the horizontal. As with the etched pockets 26, the slope of the sidewalls 28 of the penetrating projections 30 is a function of the different etch rates of monocrystalline silicon along the different crystalline orientations. The surface of the substrate 10 represents the (100) planes of the silicon which etches faster than the sloped sidewalls that represent the (111) plane. In addition to sloped sidewalls, the penetrating projections 30 include a tip portion. The width of the tip portion is determined by the width of the masking blocks 32 and by the parameters of the etch process. FIG. 6 clearly shows the shape of the penetrating projections 30.

In place of an anisotropic etch, an isotropic etch can be used to form the penetrating projections 30 with radiused sidewalls (not shown). For an isotropic etch in which the etch rate is the same in all directions, an etchant solution containing a mixture of HF, $HNO_3$ and $H_2O$ can be utilized. This will result in the projections 30 having a pointed tip and a radiused sidewall contour (not shown). The sidewall contour is controlled by the etch parameters (i.e., time, temperature, concentration of etchant) and by the width of the masking blocks 32.

The placement and peripheral dimensions of the penetrating projections 30 correspond to the placement and peripheral dimensions of contact locations, typically bond pads 48 (FIG. 6), on a semiconductor die 50. For example, bond pads on a die are typically polygonal shaped metal pads that are about 50-100 μm on a side and spaced apart by about 50-100 μm. The etched grooves 26 can also be located to correspond to the placement of the bond pads on the die. Furthermore, a greater or lesser number of penetrating projections 30 can be used and other patterns than the parallel space pattern of penetrating projections 30 can be used (e.g., square pattern, cross pattern, telescoping pattern).

The height of each projection 30 is preferably about 1/10 to 3/4 the thickness of a bond pad 48 (FIG. 6) on a semiconductor die 50. The projections 30 will therefore not completely penetrate the full thickness of the bond pad 48 and the surface 35 provides a stop plane for limiting further penetration of the projections 30 into the bond pad 48. In addition, the height of the projections 30 is selected to allow good electrical contact but at the same time to minimally damage the bond pad 48 (FIG. 6). As an example, the height of each penetrating projection 30 measured from a surface 35 of the substrate 10 to the tip of the projection 30 will be on the order of 2000-5000 Å. This compares to the thickness of a bond pad that is typically on the order of 6000 to 10,000 Å. Example spacing between the projections 30 would be about 5 μm, while an example length of the projections 30 (i.e., dimension perpendicular to the cross section shown) would be from 3 to 10 μm.

Next, as shown in FIG. 1E, the second etch mask 29 is stripped and a third etch mask 37 having masking blocks 36 is formed over the penetrating projections 30. The etch mask 37 and masking blocks 36 can be formed of a material such as silicon nitride as previously explained. The etch mask 37 is used to etch the substrate 10 along a profile 38 represented by the dotted lines to form raised contact structures 24 (FIG. 1F). As before, either a wet or dry isotropic or anisotropic etch process can be used to etch the substrate 10. Typical etching techniques comprise wet anisotropic etching with a mixture of $H_2O$. With an anisotropic etch the sidewalls 40 of the contact structures 24 will be sloped at an angle of about 54° with the horizontal. As shown in FIG. 1F, this forms the contact structures 24 with sloped sidewalls and a generally pyramidally shaped cross section.

FIG. 2 shows a perspective view of the contact structure 24 with one side cut away to show the hollow nature of the contact structure 24. Alternately, depending on the size and shape of the masking blocks 36 (FIG. 1E) and 20 (FIG. 1B), a contact structure 24A can be formed as a continuous elongated structure. In this case an elongated groove 26A rather than an enclosed pocket 26 would be formed. The spaced contact structures 24A and penetrating projections 30A can be formed to correspond to the location of the bond pads 48 (FIG. 6) on a semiconductor die 50 (FIG. 6).

As another alternative and as shown in FIG. 2B, a contact structure 24BB can be formed with additional etched faces 49 by appropriately controlling the etch parameters.

The height of the contact structures 24 (or 24A) is selected to provide a separation distance of "A" (FIG. 6) between the die 50 and substrate 10. This helps to prevent particulate contaminants from preventing an electrical connection between the contact structure 24 (or 24A) and die 50. The height of each contact structure 24 (or 24A) measured from a surface of the substrate 10 will be on the order of 50-100 μm and the width about 40-80 μm. The length of each contact structure 24 will be approximately the same as the length of the substrate 10. The length of each contact structure 24A will be approximately the same as the width. Following formation of the contact structures 24 (or 24A), the third etch mask 37 is stripped using a suitable etchant as previously described.

The contact structures 24 (or 24A) include a flexible membrane portion 42 (or 42A) which functions as a compliant member. As clearly shown in FIG. 6, the membrane portion 42 can be formed with a thickness of (t) to achieve a desired amount of deflection and spring force (C) as the penetrating projections 30 are pressed into the bond pads 48 of the die 50 with a certain force. The spring constant (C) produced by the membrane portion 42 is dependent on its dimensions and material. These parameters can be related by the formula:

$$C = E \, w \, t^3/4 \, l^3$$

where C is the spring constant w is the width of the membrane portion 42 t is the thickness of the membrane portion 42 l is the length of the membrane portion 42

E is the modulus of elasticity of the substrate 10

The dimensions for the membrane portion 42 can be controlled by placement of the etch stop 12 and by controlling the etch processes for forming the grooves 26 and penetrating projections 30. In general, higher values for the spring constant (C) can achieved with long, thin and narrow membrane portions 42. By way of example, grooves or asperities (not shown) on the bond pad 48 that can result from probe testing at the wafer level can be compensated for by deflection of the membrane portion 42 (or 42A).

Next, as shown in FIG. 1F, following the formation of the contact structures 24 (or 24A), an insulating layer 44 is formed over the contact structures 24 (or 24A) and substrate 10. The insulating layer 44 can be formed by oxidation of the substrate 10 such as by exposing the substrate 10 to an oxidizing atmosphere in a reaction chamber. Silicon dioxide can be deposited using plasma CVD techniques. Here TEOS (tetraethylorthosilane) can be injected into the reaction chamber to grow silicon dioxide ($SiO_2$) at a temperature of about 400° C. Another commonly used insulator suitable for this purpose is $Si_3N_4$. A representative thickness for the insulating layer 44 is from about 500 Å to 6000 Å.

As also shown in FIG. 1F, a conductive layer 45 is formed on top of the insulating layer and over the contact structures 24. The conductive layer 45 is preferably a highly conductive metal such as aluminum that can be deposited and patterned as required. By way of example, the conductive layer 45 can deposited using a process such as CVD, to a thickness of about 600 Å–1200 Å and then photopatterned and etched to cover just the contact structures 24 and penetrating projections 30. One method for forming the conductive layer 45 is by electrophoretic deposition of a layer of photoresist followed by etching as disclosed in U.S. patent application Ser. No. 08/452,798, incorporated herein by reference.

Conductive traces 46 are formed on the substrate 10 in electrical communication with the conductive layer 45 for each contact structure 24. The conductive traces 46 can be formed of a same material as the conductive layer 45 using the same deposition and patterning process or alternately out of a same or different material and a subsequent deposition and patterning process. FIG. 3 shows the layout of the conductive traces 46 in the completed interconnect 52. The conductive traces 46 terminate in external contacts 53 that allow the conductive traces 46 to be electrically connected to external circuitry by wire bonding or other electrical connection.

Figure 4:
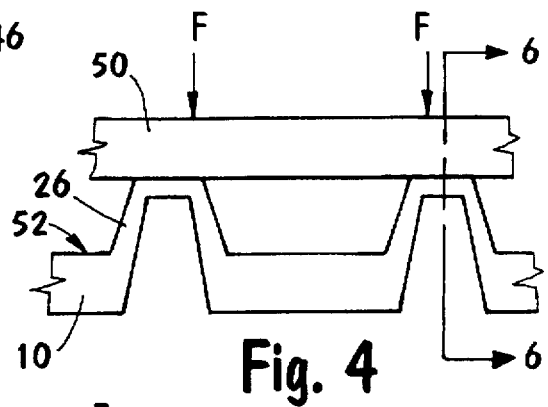
FIG. 4 is a schematic cross sectional view of an interconnect constructed in accordance with the invention in use establishing an electrical connection with a semiconductor die.

With reference to FIG. 4, the interconnect 52 is adapted for use with a carrier for testing the die 50. The carrier can be constructed as disclosed in U.S. Pat. No. 5,408,190 which is incorporated herein by reference. The interconnect 52 is pressed against the die 50 as denoted by the force arrows (F). A force distribution mechanism (not shown) as disclosed in the above cited patent can be utilized to press the interconnect 52 against the die 50. With the interconnect 52 pressed against the die 50, the conductive traces 46 (FIG. 3) on the interconnect 52 engage mating conductive elements (not shown) formed on the carrier.

The conductive elements on the carrier are connectable to external test circuitry. The test circuitry is adapted to generate test signals for testing the operability of the integrated circuits formed on the die 50. The carrier can include provision for aligning the die 50 and interconnect 52 together such as alignment pins (not shown) adapted to engage mating openings (not shown) on the interconnect 52. Alternately optical alignment techniques such as flip chip optical alignment can be used to align the bond pads 48 on the die 50 with the raised contact structures 24 on the interconnect 52. By way of example, an aligner bonder tool as described in U.S. Pat. No. 4,899,921 to Bendat et al. can be used to optically align the die 50 and interconnect 52.

With reference to FIG. 6, with the die 50 held in the carrier and aligned with the interconnect 52, the interconnect 52 and die 50 are biased together such that the projections 30 on the contact structures 24 (or 24A) penetrate into the bond pads 48 on the die 50. The projections 30 completely penetrate any oxide layer covering the bond pads 48 to establish an ohmic connection. At the same time, a penetration depth of the projections 30 into the bond pad 48 is limited by the stop plane formed by the top surface 35 (or 35A) of the contact structures 24.

With the force (F) (FIG. 4) exerted on the interconnect 52, the membrane portion 42 of the contact structure 24 flexes, as illustrated by the dotted lines in FIG. 6, to accommodate variations in the vertical locations of the bond pads 48 on the die 50. In addition, this flexure can accommodate imperfections in the surface of the bond pad 48 such as grooves and asperities that can be formed by probe testing. The flexibility provided by the membrane portion 42 improves the force distribution and provides a larger force distribution window. In addition, because the contact structure 24 is compliant, the leveling of the interconnect 52 and die 50 become less critical and the electrical connection is more stable.

Figure 5:
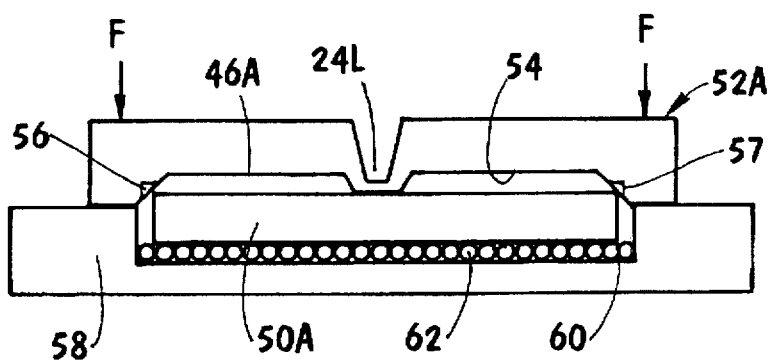
FIG. 5 is a schematic cross sectional view illustrating an interconnect constructed in accordance with an alternate embodiment of the invention in use for testing a lead-on-chip semiconductor die.

An alternate embodiment interconnect 52A is shown in FIG. 5. The interconnect 52A can be constructed for use with a carrier 58 for establishing a temporary electrical connection with a lead-on-chip (LOC) die 50A. The interconnect 52A includes an etched recess 54 wherein the contact structures 24B are located. The etched recess 54 is formed prior to formation of the penetrating projections 30 using an etch process such as an anisotropic etch process as previously described using a hard mask (e.g., silicon nitride) and a wet etchant (e.g., $KOH:H_2O$).

In the alternate embodiment interconnect 52A, the conductive traces 46A are formed within the recess 54 and extend to the lateral edges of the interconnect 52A. The sidewalls of the recess 54 include parallel etched flats or half mesas wherein elastomeric pads 56 are mounted. The elastomeric pads 56 can be formed of an elastomeric material such as silicone. The elastomeric pads 56 are adapted to contact the face of the die LOC die 50A along the longitudinal edges thereof. A plurality of biasing members 62 are located within the cavity 60 for biasing the backside of the die 50A against the contact structures 24B. The biasing members 62 can be formed as separate rods of material as shown or alternately as a pad of material. The biasing members 62 can be formed of an elastomeric material such as silicone.

As other possible alternate embodiments, the interconnect 52 can be constructed for use in testing dice contained on a wafer, or for establishing a permanent electrical connection to dice such as in the construction of multi-chip modules.

Referring now to FIGS. 7A–7F, a process for forming another alternate embodiment interconnect is illustrated. Initially as shown in FIG. 7A, a substrate 10AA is formed as previously described. A hard mask 29AA with masking blocks 32AA is then formed. The hard mask 29AA and masking blocks 32AA are equivalent to the hard mask 29 and masking blocks 32 (FIG. 1C) previously described.

Next, as shown in FIG. 7B, the masking blocks 32AA are used in an etch process to form penetrating projections 30AA. This etch process and the penetrating projections 30AA formed thereby are equivalent to the etch process and projections 30 (FIG. 1D) previously described.

Next, as shown in FIG. 7C, a hard mask 37AA with masking blocks 36AA is formed. The hard mask 37AA and masking blocks 36AA are equivalent to the hard mask 37 and masking blocks 36 (FIG. 1E) previously described.

Next, as shown in FIG. 7D, the contact structure 24AA is etched using the masking blocks 36AA. The contact structure 24AA is equivalent to the contact structure 24 previously described. As also shown in FIG. 7D, a first implant mask 64 is formed on the substrate. Depending on a subsequent implant step, the implant mask 64 can be a resist mask or a hard mask formed of a material such as silicon nitride. The implant mask 64 includes open areas 68 that leave the contact structure 24AA and a surrounding area unprotected. Viewed from above, the unprotected area has a peripheral shape that is square or rectangular and preferably symmetrically formed about the contact structure 24AA.

Using the implant mask 64, the unprotected portion of the substrate 10AA is implanted with a dopant 66 such as boron, into a previously lightly doped portion of the substrate 10AA. The dopant 66 is implanted and then driven into the substrate 10AA to a depth of D1 using techniques that are known in the art. By way of example, thermal diffusion can be used or alternately ion implantation followed by thermal furnace anneal or rapid thermal anneal (RTA).

Next, as shown in FIG. 7E, the first implant mask 64 is stripped and a second implant mask 72 is formed on the substrate 10AA. The implant mask 72 includes open areas 70 aligned with the peripheral edges of the previously implanted area of the substrate 10AA. Viewed from above, the open areas 70 encircle the contact structure 24AA in a square or rectangular pattern. Using the open areas 70 of the mask 72, the substrate 10AA is implanted with dopants 66 to a depth of D2. As before, the dopants 66 can be implanted using techniques that are known in the art (e.g., plasma doping, ion implantation).

Next, as shown in FIG. 7F, the substrate 10AA is etched with an etchant that will remove the undoped portions of the substrate 10AA but not the doped portions. These ion implanted doped portions act as etch stops. Preferably the etch process is an isotropic etch. For a substrate 10AA formed of monocrystalline silicon doped with the above dopants, an anisotropic wet etch can be performed using a solution of $KOH:H_2O$, followed by an isotropic etch of $HF:H_2O:HNO_3$.

The wet etch process forms a compliant base 74 that includes a hollowed out interior portion 76, connecting portions 78 and a membrane portion 80. The membrane portion 80 is substantially equivalent in function to the membrane portion 42 (FIG. 6) on the contact structure 24 previously described. The membrane portion 42 has a thickness "t2" approximately equal to the depth D1 of the first implant (FIG. 7D). This thickness "t2" can be formed as previously described to achieve a desired spring constant (C) or compliancy for the compliant base 74. As also shown in FIG. 7F, the connecting portions 78 have a thickness that is approximately equal to the depth D2 of the second implant (FIG. 7E).

As shown in FIG. 7FF, the compliant base 74 is generally rectangular in shape and the contact structure 24AA rests atop the base 74 spaced from the surface of the substrate 10A by the connecting portions 78.

Following the formation of the compliant base 74, an insulating layer (not shown), a conductive layer 45AA and conductive traces 46AA are formed which are substantially equivalent to the insulating layer 44 (FIG. 6), conductive layer 45 (FIG. 6), and conductive traces 46 (FIG. 3) as previously described. An interconnect formed with the compliant base 74 functions in substantially the same manner as the interconnect 52 previously described.

Figure 8A:
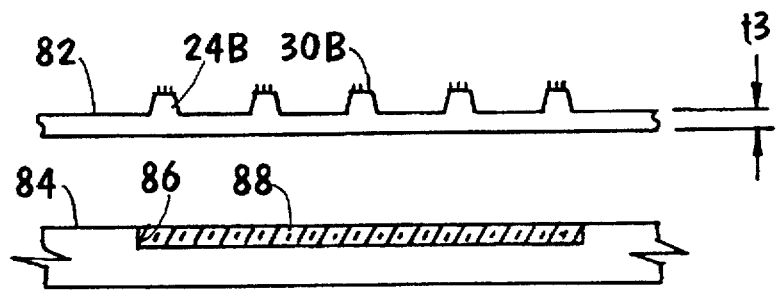
FIGS. 8A and 8B are schematic cross sectional views of an alternate embodiment interconnect.
Figure 8B:
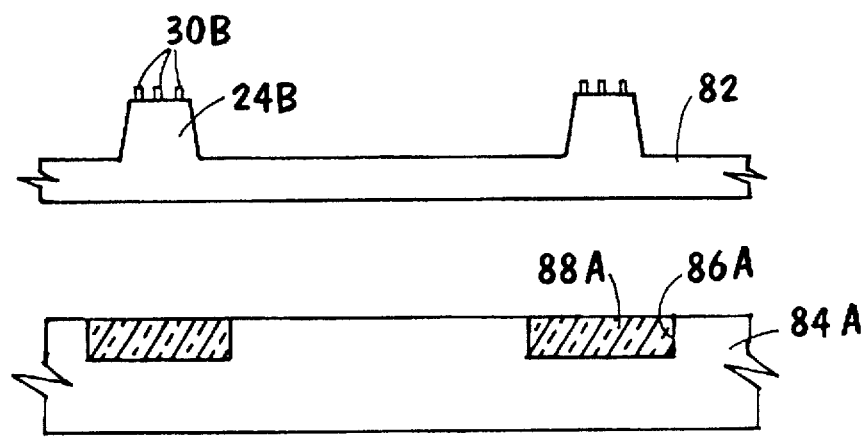

Referring now to FIGS. 8A and 8B, another alternate embodiment of the invention is shown. In FIG. 8A, raised contact structures 24B are formed on a flexible silicon membrane 82. The raised contact structures 24B can be formed substantially as previously described as raised pillars having raised penetrating projections 30B. In addition, an insulating layer (not shown) equivalent to insulating layer 44 (FIG. 6) and a conductive layer (not shown) equivalent to conductive layer 45 (FIG. 6) previously described are formed.

The flexible silicon membrane 82 is substantially equivalent to the substrate 10 previously described but is formed with a thickness of "t3" that permits a desired amount of flexure. The thickness of "t3" can be achieved by back grinding or chemically etching a thicker block of silicon material. Preferably this is done after formation of the raised contact structures 24B. The thickness "t3" is preferably about 10 to 20 μm.

The flexible silicone membrane 82 with the raised contact structures 24B formed thereon is assembled with a support substrate 84. In the assembled structure the flexible silicone membrane 82 rests directly on the support substrate 84. The support substrate 84 is preferably formed of silicon and includes an elongated etched pit 86. The placement of the etched pit 86 corresponds to the placement of the contact structures 24B. In FIG. 8B an etched pit 86A is formed for every contact structure 24B.

The etched pit 86 (or 86A) is filled with an elastomeric material 88 (or 88A). In the assembled structure the elastomeric material 88 is subjacent to the contact structures 24B. The elastomeric material 88 under the contact structures 24B permits the contact structures 24B to move vertically (i.e., up and down) to function as compliant members during use (e.g., testing of a semiconductor die). The elastomeric material 88 also serves the function of an adhesive for securing the flexible silicone membrane 82 to the support substrate 84. One suitable material for the elastomeric material 88 is a silicone adhesive manufactured by Zymet.

Thus the invention provides a method for forming compliant contact systems that are particularly useful in establishing a temporary electrical connection with semiconductor dice for testing. It is anticipated that such compliant contact systems can also be used in establishing a permanent electrical connection with semiconductor dice such as in the formation of multi-chip modules.

While the invention has been described with reference to certain preferred embodiments, as will be apparent to those skilled in the art, certain changes and modifications can be made without departing from the scope of the invention as defined by the following claims.

What is claimed is:

1. A method for forming an interconnect for making an electrical connection with a semiconductor die, said method comprising:
   providing a substrate;
   forming a raised contact on the substrate corresponding to a contact location on the die;
   etching a portion of the substrate subjacent to the raised contact to form a tip portion of the raised contact as a flexible membrane; and
   forming a conductive layer on the raised contact insulated from the substrate by an insulating layer.

2. The method as claimed in claim 1 and further comprising forming a projection on the raised contact for penetrating the contact location on the die to a limited penetration depth.

3. The method as claimed in claim 1 and further comprising testing a semiconductor die using the interconnect.

4. The method as claimed in claim 1 and further comprising forming an etch stop to control an end point during etching of the interior portion of the raised contact.

5. The method as claimed in claim 1 and wherein the raised contact is formed as a raised pillar by anisotropically etching the substrate.

6. The method as claimed in claim 1 and wherein a penetrating projection is formed on the raised contact for penetrating the contact location on the die to a limited penetration depth and the raised contact is formed with a height to provide a separation distance between the die and interconnect.

7. A method for forming an interconnect for making an electrical connection with a semiconductor die, said method comprising:

providing a substrate with a first and second side;

forming a first mask on the substrate and etching the first side of the substrate to form a raised projection for penetrating a contact location on the die;

forming a second mask on the raised projection and etching the first side of the substrate to form a raised contact with the projection thereon;

forming a third mask on the substrate and etching the second side of the substrate to form a tip portion of the raised contact as a flexible membrane with a desired thickness; and forming a conductive layer on the raised contact insulated from the substrate by an insulating layer.

8. The method as claimed in claim 7 and further comprising forming a conductive trace on the substrate in electrical communication with the conductive layer.

9. The method as claimed in claim 7 and further comprising forming an elastomeric member on the interconnect for contacting the die.

10. The method as claimed in claim 7 and wherein the second side of the substrate is etched with a hollow pocket subjacent to the raised contact.

11. The method as claimed in claim 7 and wherein the second side of the substrate is etched with an elongated groove subjacent to the raised contact.

12. The method as claimed in claim 7 and further comprising implanting a dopant in the substrate to a desired depth to control an endpoint during etching of the second side of the substrate.

13. The method as claimed in claim 7 and further comprising placing the interconnect and die in a carrier adapted to bias the die and interconnect together with a force.

14. The method as claimed in claim 7 and wherein the raised contacts are formed with a height to permit a desired separation of the die and interconnect.

15. The method as claimed in claim 7 and further comprising forming a fourth mask on the substrate and etching the first side of the substrate with a recess such that the contact member is formed in the recess.

16. A method for forming an interconnect for making an electrical connection with a semiconductor die, said method comprising:

providing a substrate having a first side and a second side;

forming a first mask on the first side of the substrate and etching the substrate to form a raised projection adapted to penetrate the die to a limited penetration depth;

forming a second mask having a masking block covering the raised projection and etching the substrate to form a raised contact adapted to contact a contact location on the die, said raised contact having a tip portion with the projection thereon, said raised contact having a height for separating the substrate and interconnect by a desired amount;

forming a third mask on the second side of the substrate and etching the substrate such that the tip portion of the raised contact is formed with a desired thickness;

forming an insulating layer on the substrate; and forming a conductive layer on the raised contact insulated from the substrate by the insulating layer.

17. The method as claimed in claim 16 and further comprising biasing the interconnect against the die with a force for establishing a temporary electrical connection for testing the die.

18. The method as claimed in claim 16 and wherein a plurality of raised contacts having a hollow etched pocket are formed corresponding to a plurality of contact locations on the die.

19. The method as claimed in claim 16 and wherein the raised contact is a continuous structure having a plurality of projections thereon corresponding to a plurality of contact locations on the die.

20. The method as claimed in claim 16 and further comprising forming a fourth mask on the first side of the substrate and etching the substrate to form a recess wherein the raised projection is formed.

21. The method as claimed in claim 20 and further comprising forming a groove in the recess and placing an elastomeric member in the groove for contacting the die.

22. The method as claimed in claim 16 and wherein the raised contact is formed by an anisotropic etch process as a pillar having sloped sidewalls.

23. The method as claimed in claim 16 and wherein the projection is formed by an anisotropic etch process as a blade having sloped sidewalls.

24. The method as claimed in claim 16 and wherein the substrate is formed of a material selected from the group consisting of monocrystalline silicon, silicon-on-glass, silicon-on-sapphire, germanium, and ceramic.

25. The method as claimed in claim 16 and further comprising forming the raised contact with the height between about 50–100 µm.

26. The method as claimed in claim 16 and further comprising controlling the thickness and dimensions of the tip portion to provide a desired amount of flexibility for the tip portion.

27. The method as claimed in claim 16 and further comprising controlling the thickness of the tip portion by forming an etch stop in the substrate for end pointing etching with the third etch mask.

28. The method as claimed in claim 26 and wherein the etch stop is formed by implanting a dopant into the substrate to a desired depth.

29. A method for forming an interconnect for making an electrical connection with a semiconductor die, said method comprising:

providing a substrate;

forming a raised contact on the substrate adapted to contact a contact location on the die;

implanting a dopant into the substrate to define a base for the raised contact;

etching an undoped portion of the substrate surrounding the raised contact to form said base with a flexible membrane portion and connecting portions attached to the substrate formed, said membrane portion and connecting portions formed of doped substrate; and forming a conductive layer on the raised contact insulated from the substrate by an insulating layer.

30. The method as claimed in claim 29 and wherein a thickness of the membrane portion is determined by implanting the dopant to a first depth and a height of the connecting portions is determined by implanting the dopant to a second depth.

31. The method as claimed in claim 29 and wherein the base portion is generally rectangular shaped.

32. The method as claimed in claim 29 and further comprising forming a penetrating projection on the raised contact adapted to penetrate the contact location on the die to a limited penetration depth.

33. A method for forming an interconnect for making an electrical connection with a semiconductor die, said method comprising:

provinding a flexible substrate;

forming a raised contact on the substrate adapted to contact a contact location on the die;

forming a support substrate having a pocket filled with an elastomeric material;

placing the flexible substrate on the support substrate with the raised contact atop the elastomeric material; and forming a conductive layer on the raised contact insulated from the substrate by an insulating layer.

34. The method as claimed in claim 33 and further comprising forming a penetrating projection on the raised contact adapted to penetrate the contact location on the die to a limited penetration depth.

35. The method as claimed in claim 33 and wherein the elastomeric material is a silicone adhesive.

* * * * *